(12) United States Patent
Gal et al.

(10) Patent No.: US 12,384,081 B2
(45) Date of Patent: Aug. 12, 2025

(54) MOULD HALF AND MOULD METHOD FOR TRANSFER MOULDING ENCAPSULATING ELECTRONIC COMPONENTS MOUNTED ON A CARRIER INCLUDING A DUAL SUPPORT SURFACE AND A METHOD FOR USING SUCH

(71) Applicant: Besi Netherlands B.V., Duiven (NL)

(72) Inventors: Wilhelmus Gerardus Jozef Gal, Duiven (NL); Albertus Franciscus Gerardus van Driel, Duiven (NL)

(73) Assignee: Besi Netherlands B.V., Duiven (NL)

( * ) Notice: Subject to any disclaimer, the term of this patent is extended or adjusted under 35 U.S.C. 154(b) by 657 days.

(21) Appl. No.: 17/286,992

(22) PCT Filed: Oct. 22, 2019

(86) PCT No.: PCT/NL2019/050692
§ 371 (c)(1),
(2) Date: Apr. 20, 2021

(87) PCT Pub. No.: WO2020/085899
PCT Pub. Date: Apr. 30, 2020

(65) Prior Publication Data
US 2021/0387389 A1    Dec. 16, 2021

(30) Foreign Application Priority Data
Oct. 22, 2018    (NL) ...................................... 2021845

(51) Int. Cl.
*B29C 45/14*    (2006.01)
*B29C 45/37*    (2006.01)
(Continued)

(52) U.S. Cl.
CPC ...... *B29C 45/376* (2013.01); *B29C 45/14655* (2013.01); *B29C 45/14819* (2013.01);
(Continued)

(58) Field of Classification Search
CPC ............ B29C 45/376; B29C 45/14655; B29C 45/14819; B29C 45/37; B29C 45/26;
(Continued)

(56) References Cited

U.S. PATENT DOCUMENTS 5,409,362 A    4/1995    Neu
6,471,501 B1*    10/2002    Shinma ................. B30B 15/068
425/406

(Continued)

FOREIGN PATENT DOCUMENTS

CN    1420538 A    5/2003
CN    101583475 A    11/2009
(Continued)

OTHER PUBLICATIONS

Machine translation of JP H10138302, retrieved from USPTO database Apr. 18, 2025 (Year: 2025).*

*Primary Examiner* — Timothy Kennedy
(74) *Attorney, Agent, or Firm* — The Webb Law Firm

(57) ABSTRACT

The present invention relates to a mould half for a mould for transfer moulding encapsulating electronic components mounted on a carrier, where the mould part to support the carrier has a contact surface that includes a primary carrier support surface and a the primary carrier support surface surrounding secondary surface, which surrounding secondary surface is supported by a drive for height adjustment of the secondary surface relative to the height of the primary carrier support surface. Such mould half may be used for transfer moulding of electronic components while relatively easy providing a levelled support for the carrier and compensating for any thickness variations in the carrier. The invention also provides a mould with at least two mould
(Continued)

parts and a method for transfer moulding encapsulating electronic components mounted on a carrier using such a mould.

18 Claims, 5 Drawing Sheets

(51) Int. Cl.
*H01L 21/56* (2006.01)
*B29L 31/34* (2006.01)

(52) U.S. Cl.
CPC ..... *H01L 21/565* (2013.01); *B29L 2031/3406* (2013.01); *H01L 21/561* (2013.01)

(58) Field of Classification Search
CPC ............... B29C 45/02; B29C 45/2703; B29C 2045/2717; H01L 21/565; H01L 21/561
See application file for complete search history.

(56) References Cited

U.S. PATENT DOCUMENTS

| | | | |
|---|---|---|---|
| 11,217,463 | B2 | 1/2022 | Gal et al. |
| 2001/0003049 | A1 | 6/2001 | Fukasawa et al. |
| 2002/0180105 | A1 | 12/2002 | Saito et al. |
| 2003/0038363 | A1 | 2/2003 | Matsuo |
| 2006/0267169 | A1 | 11/2006 | Bolken et al. |
| 2009/0121387 | A1* | 5/2009 | Hoogland ............. B29C 45/125 |
| | | | 264/328.8 |
| 2013/0028998 | A1 | 1/2013 | Maekawa et al. |
| 2016/0082624 | A1 | 3/2016 | Su et al. |
| 2018/0021993 | A1* | 1/2018 | Ho ................... B29C 45/14655 |
| | | | 264/272.15 |

FOREIGN PATENT DOCUMENTS

| | | | | |
|---|---|---|---|---|
| CN | 108431948 | A | 8/2018 | |
| ES | 2387905 | A1 * | 10/2012 | ............. B29C 45/26 |
| JP | H976319 | A | 3/1997 | |
| JP | 10138302 | A * | 5/1998 | ......... B29C 45/2703 |
| JP | 2000252311 | A | 9/2000 | |
| JP | 200236323 | A | 2/2002 | |
| JP | 2013028087 | A * | 2/2013 | ............... A01G 5/02 |
| KR | 20150089205 | A * | 8/2015 | |
| KR | 1020150089205 | A | 8/2015 | |
| WO | 2008085026 | A1 | 7/2008 | |
| WO | WO-2014199733 | A1 * | 12/2014 | ............. B29C 33/12 |
| WO | 2017137232 | A1 | 8/2017 | |

* cited by examiner

MOULD HALF AND MOULD METHOD FOR TRANSFER MOULDING ENCAPSULATING ELECTRONIC COMPONENTS MOUNTED ON A CARRIER INCLUDING A DUAL SUPPORT SURFACE AND A METHOD FOR USING SUCH

CROSS-REFERENCE TO RELATED APPLICATIONS

This application is the United States national phase of International Application No. PCT/NL2019/050692 filed Oct. 22, 2019, and claims priority to The Netherlands Patent Application No. 2021845 filed Oct. 22, 2018, the disclosures of which are hereby incorporated by reference in their entirety.

BACKGROUND OF THE INVENTION

Field of the Invention

The present invention relates to a mould half for a mould for transfer moulding encapsulating electronic components mounted on a carrier. The invention also relates to a mould for transfer moulding encapsulating electronic components mounted on a carrier including such a mould half as well as to a method for transfer moulding encapsulating electronic components mounted on a carrier using such mould half or mould.

Description of Related Art

The encapsulation of electronic components mounted on a carrier, also commonly called a substrate, with transferring a moulding material to one or more mould cavities is a known art. On an industrial scale such electronic components are provided with an encapsulation, usually an encapsulation of a curing epoxy or resin to which a filler material is added. There is a trend in the market toward simultaneous transfer moulding encapsulation of larger quantities of electronic components with various dimensions and with still increasing accuracy demands. This may also result in products having heterogeneous combinations of electronic components in a single package. Electronic components may be envisaged here such as semiconductors (chips, although LEDs are in this respect also deemed semiconductors) which are generally becoming increasingly smaller. After the moulding material has been transferred the collectively encapsulated electronic components are situated in an encapsulation (package) which is arranged on one but sometimes also two sides of the carrier. The moulding or encapsulation material often takes the form of a flat layer connected to the carrier in which layer the electronic components are full or partially embedded/encapsulated. The carrier may consist of a lead frame, a wafer, a multi-layer carrier—manufactured partially from epoxy—(also referred to as board or substrate and so on) or another carrier structure.

During the transfer encapsulation of electronic components mounted on a carrier, usually use is made—according to the prior art—of encapsulating presses provided with at least two mould halves, into at least one of which is recessed one or plural mould cavities. After placing the carrier with the electronic components for encapsulating between the mould halves, the mould halves are moved towards each other, e.g. such that they clamp the carrier. A, normally heated, liquid moulding material is then be fed to the mould cavities by means of transfer moulding. After at least partial (chemical) curing of the moulding material in the mould cavity/cavities, the carrier with encapsulated electronic components is taken out of the transfer moulding encapsulating press and the encapsulated products may be separated from each other during further processing. Foil may be used during the encapsulating process to, among others, screen off a part of the electronic components and so to prevent the foil covered parts of the electronic component to be covered by the moulding material. The at least partial with moulding material covered electronic components (not over moulded electronic components are referred to as "bare die" or "exposed die" products) may be used in various applications; like for instance various types of sensor components, ultra-low packages or heat dissipating components. This method of transfer encapsulation is practised on large industrial scale and enables well controlled encapsulation of electronic components. A problem of the prior art transfer encapsulation processes of electronic components is that the moulding quality is highly dependent on the accuracy of the carrier thickness, especially when the mould clamping takes place on the carrier. Variations in carrier thicknesses may lead to flash and/or bleed of moulding material (especially in case of relative thin carriers) or to damage of the carrier due to enhanced clamping pressure of the mould on the carrier.

The U.S. Pat. No. 6,471,51 discloses a mould for press-moulding semiconductor devices having a lower mould and an upper mould. The lower mould includes an inner die carrying a semiconductor device and a resin tablet as well as an outer die surrounding the inner die in a manner moveable up and down with respect to the inner die. In operation a press plate of the upper mould first engages with the outer die of the lower mould in an unlocked state to achieve an exact positioning of the press plate of the upper mould and the inner die of the lower mould. After locking the position of the press plate of the upper mould and melting the resin tablet the press plate is urged further toward the inner die of the lower mould while simultaneously lowering the outer die such that the space formed by the lower die, the outer die and the press plate is reduced.

SUMMARY OF THE INVENTION

The present invention has for its object to provide an alternative mould and method for transfer moulding encapsulating electronic components that are less sensitive to variations in carrier thicknesses and that are easy to control.

In order to provide a moulding solution for transfer moulding encapsulating electronic components mounted on a carrier that is less sensitive to carrier thickness variations the present invention provides a mould half for a mould for transfer moulding encapsulating electronic components mounted on a carrier, wherein the mould part to support the carrier has a contact surface that comprises a primary carrier support surface and a—the primary carrier support surface surrounding—secondary surface, which surrounding secondary surface is supported by a drive for height adjustment of the secondary surface relative to the height of the primary carrier support surface. Such mould half may comprise a mould half base that is stationary connected to the primary carrier support surface and that is adjustable connected with the surrounding secondary surface through the drive for height adjustment. The primary carrier support surface may thus be implemented as a solid (and simple) construction that is relatively easy to provide a levelled support (a flat and even surface) for the carrier and the displacement of the secondary surface may compensate for any thickness variations in the carrier as will be explained later in relation to the moulding method according the present invention. The primary carrier support surface is also easy to produce. Furthermore the mutual positioning of the mould half primary and secondary surfaces may also compensate for any variation due to temperature changes of the mould half (e.g. variations in expansion and/or shrinkage due to temperature changes in the mould half parts). The primary carrier support surface and the secondary surface will normally be parallel. Further advantages of the present mould half is the enhanced flexibility in use it provides. So is it for instance possible to lower the secondary surface to the level of the primary carrier support surface or lower to enable easy cleaning of the primary carrier support surface (as it enables easy access to the complete primary surface) but also to enable inspection of the primary carrier support surface with for instance grazing light (which type of inspection also makes is possible to visualise very tiny particles in the order of 10-100 µm). Yet another advantage is that by lowering the secondary surface easy access to sides of a carrier positioned on the primary carrier support surface may be provided. This enables for instance a simple picking up a moulded carrier. The mould according the invention also provides the opportunity to prevent relative tilt of the mould halves at the moment of closure, especially the moment of dual contact with the carrier), Relative tilt of the mould halves during closing (even when very limited) may lead to uneven load on the carrier and this to a risk of carrier damage. By bringing the secondary surface in contact with the opposite mould before contacting the carrier the opposite mould part may be "guided"' to a more parallel position (in contrast with a limited tilted relative position). Especially the actual development in the market of wafers more and more being used as carries for electronic components to be moulded makes the advantages of the present invention even more important; the primary support surface is stable and solid and enables the required accurate positioning of a wafer. And also the high accuracy in inspection possibilities of small dirt particles is highly welcome when processing high sensitive wafers.

The drive for height adjustment of the secondary surface relative to the height of the primary carrier support surface may be pressure (or load). With a pressure controlled height adjustment the moulding process may be controlled independent from the carrier thickness; the closure may be controlled by pressure instead of by position. This makes the process more stable and limits the chances of carrier damage due to high pressures exerted (e.g. crack) but also limits the chances of leakage (e.g. flash, bleed) due to low pressures exerted. As an alternative for pressure (load) controlled height adjustment of the secondary surface the height adjustment of the secondary surface may also be position controlled. The present invention also enables to close the mould halves first on closing onto the carrier (with the secondary surface of the mould half not absorbing any closing forces) and subsequently to move the secondary surface to a closing position providing an additional safeguard against leakages.

The drive for height adjustment of the secondary surface may comprises at least one moveable wedge that may be displaces using pneumatic or hydraulic cylinders, spindle drives, tooth and rack systems or any other type of accurate linear drives. Using one or more wedges for the height adjustment of the secondary surface enables besides accurate positioning a large support surface of the secondary surface thus preventing any undesired deformation of the secondary surface. A further advantage of the use of wedges is that they require relative limited force to displace but that they may carry substantive loads. Especially—but not exclusively—when wedges with smaller angels are applied the wedges may be self-inhibitory which is not easy to steer in process control but also is beneficial to limit the chance of carrier cracks even further. A pneumatic or hydraulic cylinder for wedge displacement provides the ability of easy pressure controlled closure of the secondary surface and are easy to obtain as off the shelf products. As an alternative for the use of wedges also linear drives may be directly coupled to the secondary surface, so that the direction of displacement of the secondary surface is in line with the drive system used (see also FIG. 2). Besides the drives mentioned here also other drives may be used like for instance a spindle drive systems, rack and pinion wheel drives, and so on.

The secondary surface may also carry at least one guide for transfer moulding encapsulating material. This makes it possible to use the secondary surface for the positioning of a so called "top edge" moulding material feed. A top edge moulding material feed is a well know technique used to bring the moulding material to the carrier passing the side of the carrier without chances of leakage and also keeping the border (rim/edge) of the carrier free of moulding material. The prior art top edge moulding material feeds normally require a separate top edge feed support that may now be integrated with the secondary surface and thus makes the construction of a moulding apparatus simpler, more reliable and cheaper.

In a further embodiment the primary and secondary surface may at least be moveable between a position wherein the primary and secondary surface are on the same level (or lower) and a position wherein the secondary surface is equal or more than the thickness of a carrier higher than the primary surface. The advantages of the primary and secondary surfaces being on the same level or lower have already been mentioned (easy carrier access, ease of cleaning and inspection). To prevent leakage of moulding material between juncture of the primary and the secondary surface it may be advantageous to provide a gasket between the primary and secondary surface. Such gasket may even further be optimised by making it controllable (operable), e.g. by choosing for an inflatable gasket, so that it only functions as a gasket at the moments the sealing capacity is required. The use of a gasket or controllable gasket may be practised to prevent leakage so to enable an under pressure in the moulding cavity but also to prevent pollution (to keep dirt out) and in specific embodiments also to prevent passage of (liquid) moulding material.

The mould half may also comprise a measurement sensor for measuring the relative position of the primary and secondary surfaces. Measuring the relative position of the primary and secondary surfaces may be used as a measurement signal for the thickness of individual carriers processed on the mould half and thus provides additional product information, for instance to be used in subsequent process steps and/or as product related information.

The present invention also provides a mould for transfer moulding encapsulating electronic components mounted on a carrier, comprising at least two mould parts which are displaceable relative to each other, comprising a mould half according the present invention and as described above and an opposite clamping mould part. At least the opposite clamping mould part may be provided with at least one mould cavity recessed in a contact side, with the contact side of the opposite clamping mould part with the at least one mould cavity being configured to engage on the carrier around the electronic components to be encapsulated. With such mould the advantages as mentioned above in relation to the mould half according the present invention may be realised. The opposite mould half may contact the carrier such that the mould cavity mould is allocated around the electronic components to be encapsulated and the clamping force of the mould halves may be limited to the level that leakage (bleed and flash) is at least prevented; a higher pressure is not needed. The secondary support surface may be used for maintaining the position of the carrier on the primary carrier support surface and for an additional closing off (a second barrier) against leakage. The contact side of the opposite clamping mould part may also be provided with a feed channel for moulding material; the moulding material may thus fed over the top of the carrier there where the opposite mould part clamps onto the carrier. Such transfer moulding technique is also referred to as "top edge" moulding.

In yet a further embodiment of the mould for transfer moulding encapsulating electronic components mounted on a carrier a moulding material feed (top edge) is provided between the opposite clamping mould parts and at least one of the clamping mould parts is provided with an aperture to hold the moulding material feed in a clamped position of the opposite clamping mould parts. Such moulding material feed may be supported by the second support surface of the lower mould half. By correct support, thus by correct positioning of the second support surface any excess pressure on the carrier—which could lead to carrier crack (wafer crack) may successfully be prevented.

The present invention also provides a method for transfer moulding encapsulating electronic components mounted on a carrier using a mould half according the present invention and as described above, comprising the processing steps of: a) positioning a carrier onto the primary surface of the carrier supporting mould half such that the electronic components face a mould cavity, wherein the secondary support surface is located on the same side of the electronic components carrying surface of the carrier as the primary support surface; b) moving the mould parts towards each other, such that the mould parts are clamping the carrier between the primary support surface and the mould cavity recessed contact side, while the mould cavity is enclosing the electronic components to be encapsulated; c) moving the secondary support surface towards the mould cavity recessed contact side of the opposite clamping mould part; d) transferring a liquid moulding material via a feed channel in the mould cavity recessed contact side into the mould cavity; e) at least partially curing the moulding material; f) moving the mould parts apart from each other; and g) removing the carrier with moulded electronic components from the primary support surface of the carrier supporting mould half. After the mould halves are moved apart the secondary support surface may be moved below the electronic components carrying surface of the carrier (that is to say further away from the opposite mould part than the electronic components carrying surface of the carrier). During processing step c) the secondary support surface may be moved towards the mould cavity recessed contact side of the opposite mould part until a specific closing pressure level of the secondary support surface is reached. With such method the moulding process is "anticipating" on the carrier thickness. This moulding process is especially suited for transfer moulding; the moulding cavity is formed and subsequently the liquid moulding material is fed to the moulding cavity, preferably via a feed channel for moulding material recessed into the contact side of the opposite clamping mould part. The process may be performed independent the exact thickness of the carrier influencing the outcome (the quality of moulded electronic components) and even more the process is robust and stable to be executed.

For the moulding method according the present invention the position of the secondary support surface relative to the primary support surface may be registered and for instance fed back to an automatic process control. Such information on the relative position of the primary carrier support surface and the secondary surface may be used to provide information on the dimension (thickness) of the carrier and thus the measurement information provided forms an additional benefit of the present invention.

BRIEF DESCRIPTION OF THE DRAWINGS

The present invention will be further elucidated on the basis of the non-limitative exemplary embodiments shown in the following figures. Herein shows.

DESCRIPTION OF THE INVENTION

Figure 1:
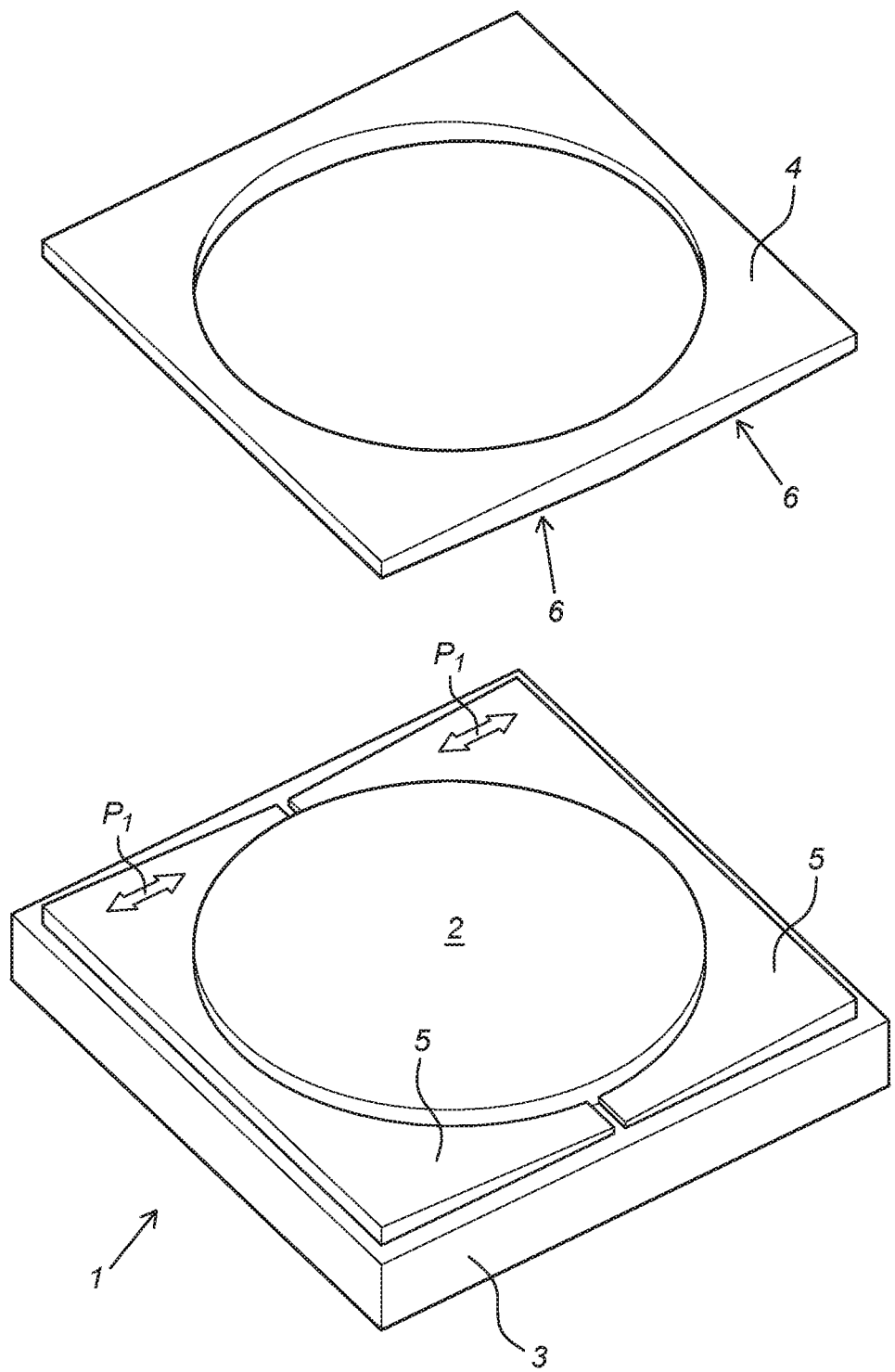
FIG. 1 a schematic perspective exploded view on a mould part according the present invention.

FIG. 1 shows a mould part 1 for carrying a carrier with electronic components (not represented in this figure) having a primary carrier support surface 2 that is solid integrated with a mould half base 3. The primary carrier support surface 2 is surrounded by a secondary surface 4, which secondary surface 4 is supported by wedges 5. By moving the wedges 5 according arrows $P_1$ (in a direction parallel to the primary carrier support surface 2 and the secondary surface 4) the height of the secondary surface 4 relative to the primary carrier support surface 2 is adjustable. The side of the secondary surface 2 directed towards the wedges 5 is chamfered 6 for collaboration with the wedges 5

Figure 2:
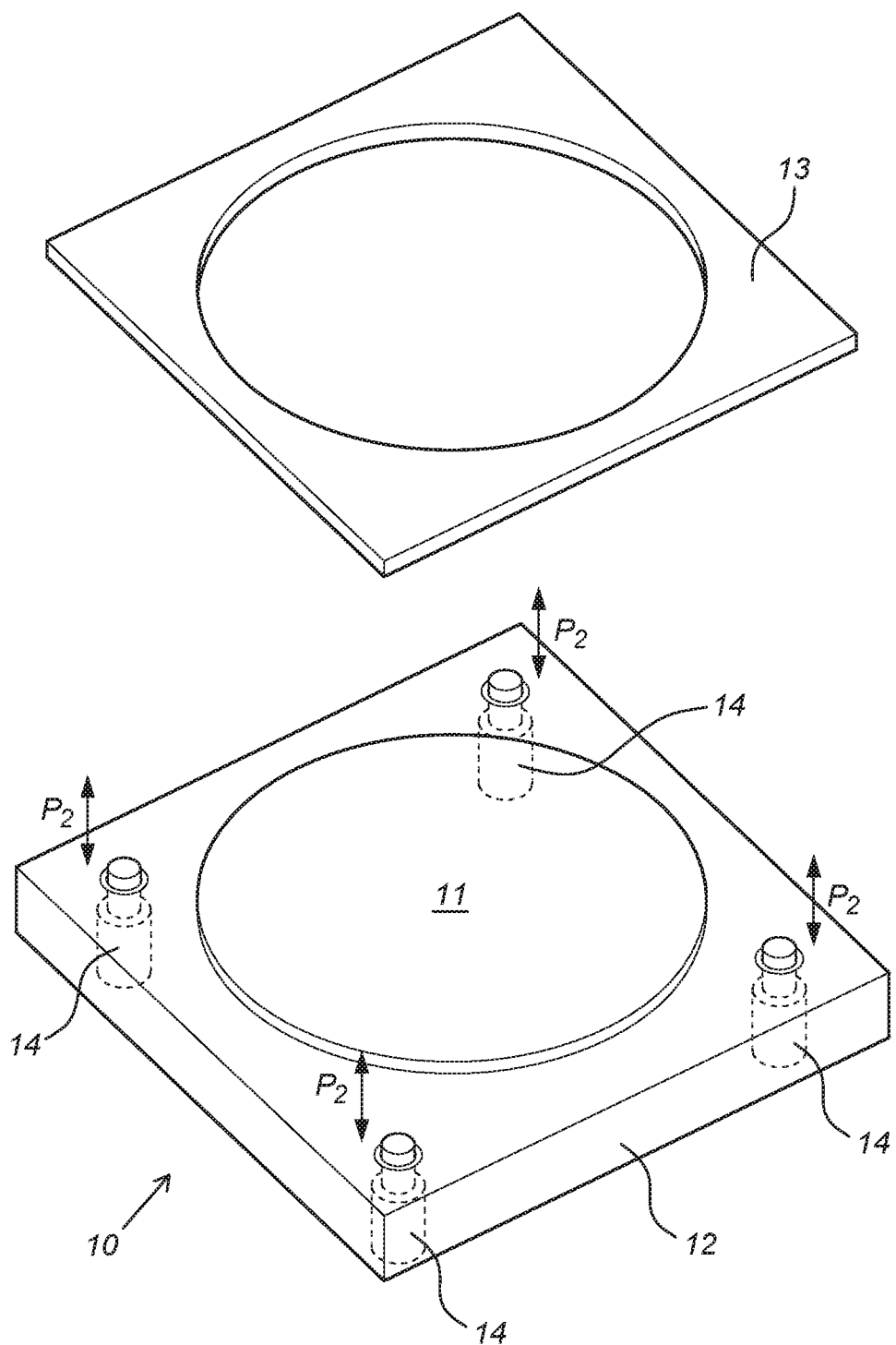
FIG. 2 a schematic perspective exploded view on an alternative embodiment of a mould part according the present invention.

In FIG. 2 an alternative mould part 10 is shown having a primary carrier support surface 11 that again is solid integrated with a mould half base 12. The primary carrier support surface 11 is surrounded by a secondary surface 13, which secondary surface 13 is supported by cylinders 14, which cylinders (for instance hydraulic or pneumatic cylinders) are integrated in the mould half base 12. By actuating the cylinders 14 according arrows $P_2$ (in a direction perpendicular to the primary carrier support surface 2 and the secondary surface 4) the height of the secondary surface 13 relative to the primary carrier support surface 11 is adjustable.

Figure 3A:
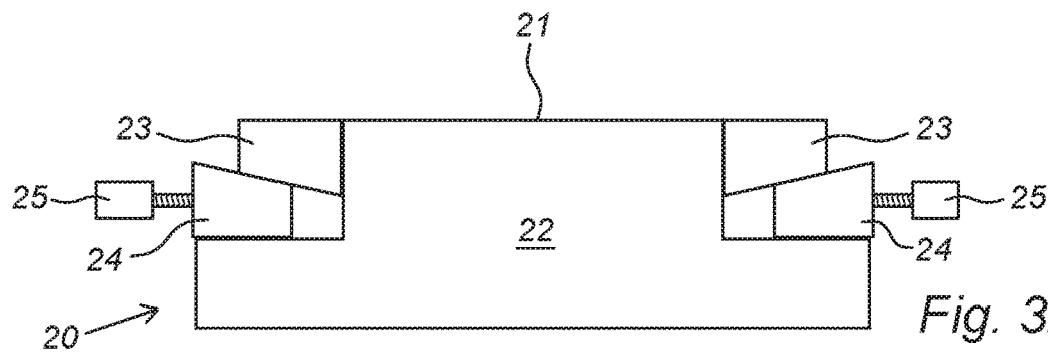
FIGS. 3A-3G schematic represented subsequent steps of a moulding method according the present invention.

FIG. 3A shows a mould half 20 with a primary carrier support surface 21 that is solidly integrated with a mould half base 22. The primary carrier support surface 21 is surrounded by a secondary surface 23, which secondary surface 23 is supported by wedges 24 that are displaceable by electric driven spindles 25. The secondary surface 23 is levelled with the primary carrier support surface 21 enabling e.g. easy access to the primary carrier support surface 21 for cleaning and/or inspection purposes.

Figure 3B:
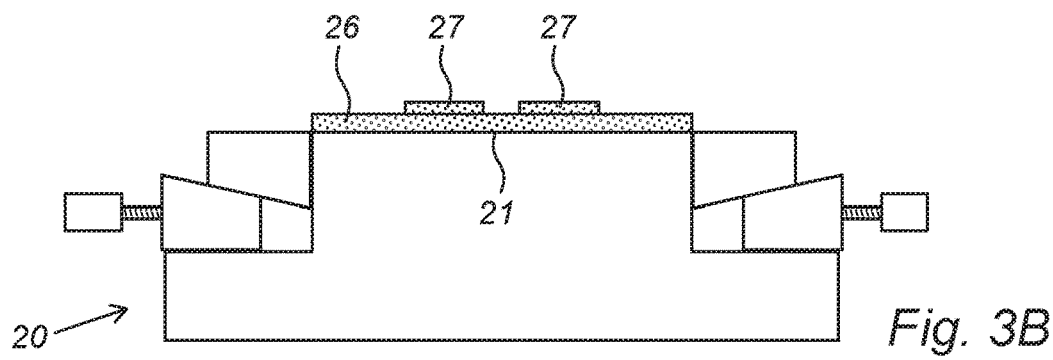

In FIG. 3B the mould half 20 from FIG. 3A is shown again now with a carrier 26 of electronic components 27 placed onto the primary carrier support surface 21. The secondary surface 23 is still in the lower position as shown in FIG. 3A.

Figure 3C:
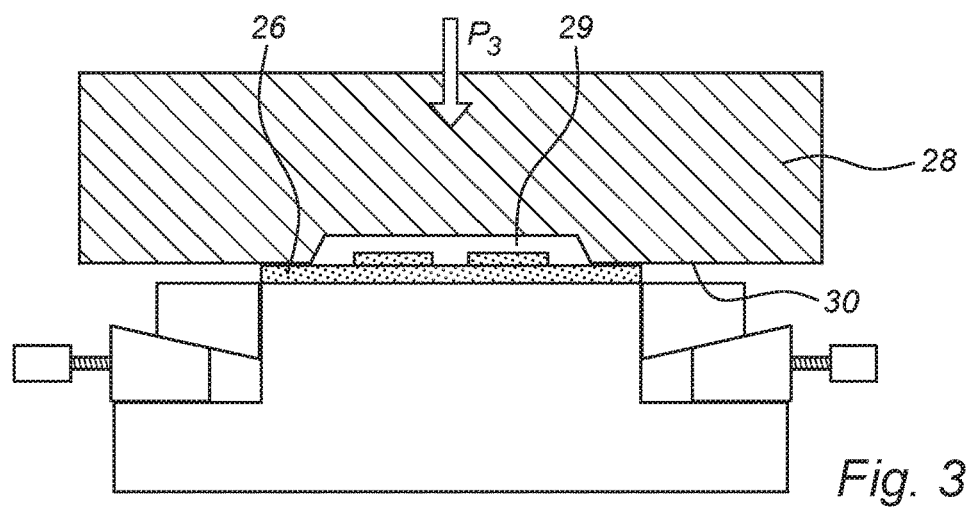

In FIG. 3C a second mould part 28 (here upper mould part) is closed according arrow $P_3$ onto the carrier 26 such that a moulding cavity 29 recessed in a contact side 30 of the second mould 30 encloses the electronic components 27 to be encapsulated.

Figure 3D:
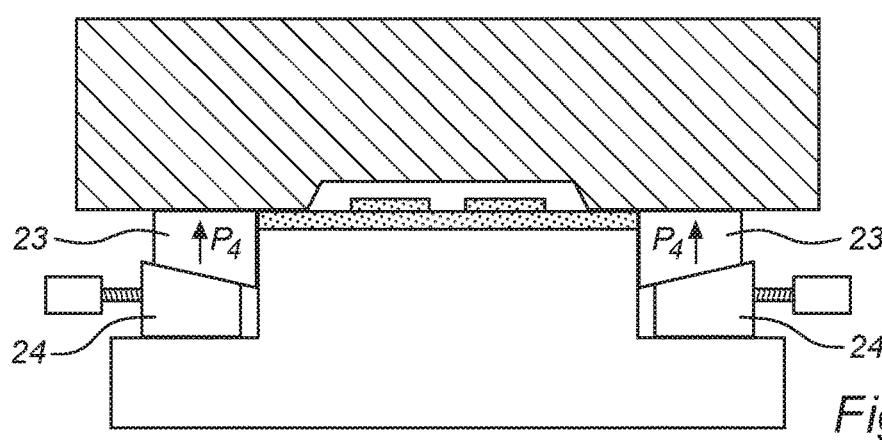
Figure 3E:
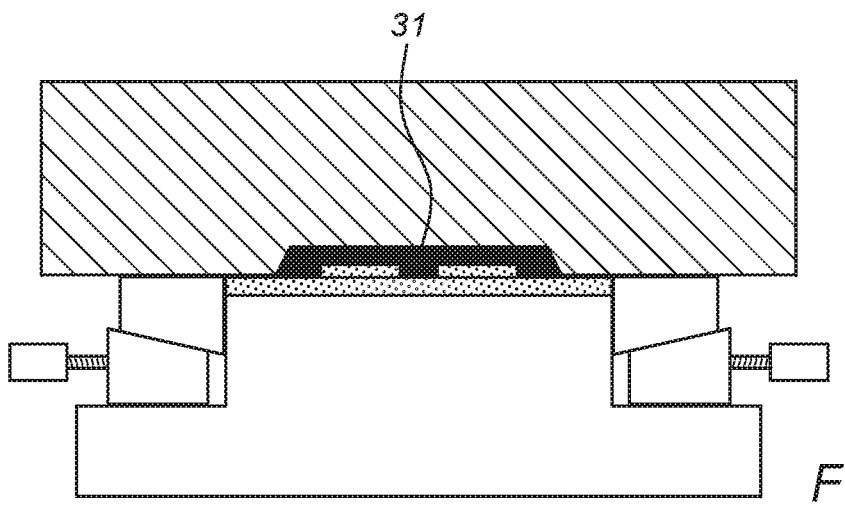
Figure 3F:
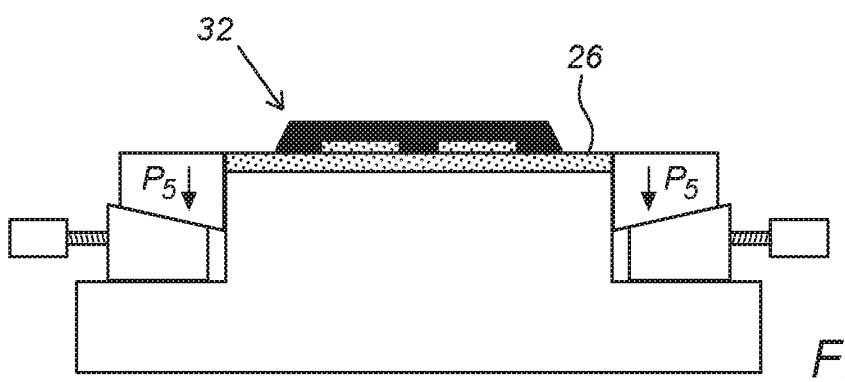

In FIG. 3D the secondary surface 23 is moved according arrow $P_4$ against the contact surface 30 of the second mould part 28 thus further confining the carrier 26 with electronic components 27. In subsequent FIG. 3E a moulding material 31 is fed to the moulding cavity 29. After curing as shown in FIG. 3F the second mould part 28 may be removed (moved away from the a mould half 20 with the primary carrier support surface 21) thus loosening the moulded electronic components 32 on the carrier 26 from the second mould part 28.

Figure 3G:
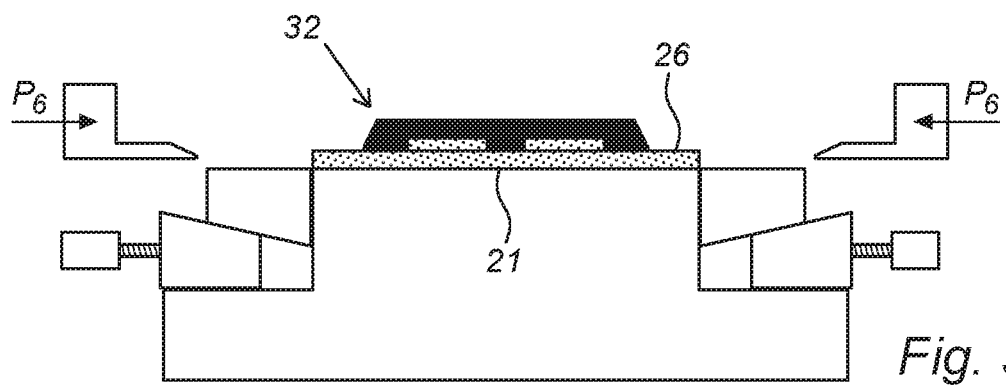

In FIG. 3G is shown that the secondary surface 23 is moved downwards with the spindle 25 driven wedges 24 according arrows $P_5$ so enabling access to the sides of the carrier 26, for instance to allow grippers 33 to come in (see arrows $P_6$) and to remove the moulded electronic components 32 on the carrier 26 from the primary carrier support surface 21.

Figure 4:
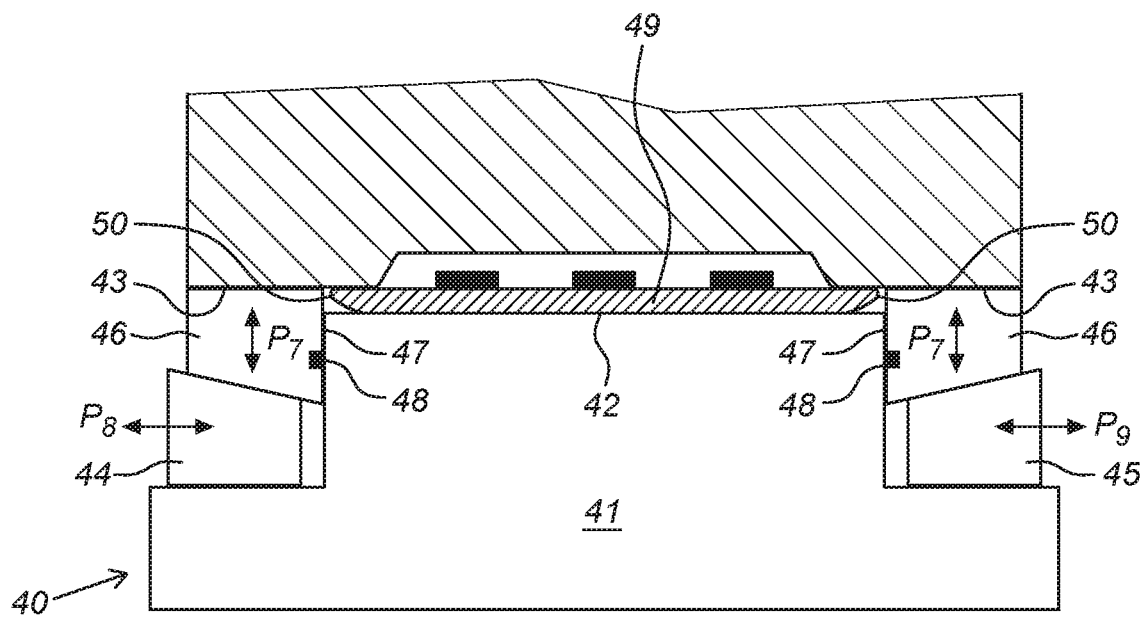
FIG. 4 a cross section of a schematic represented mould according the present invention.

FIG. 4 shows a cross section of a further alternative mould 40 with a mould base 41 and integrated primary carrier support surface 42, the integrated primary carrier support surface 42 being surrounded by a secondary surface 43. The height of the secondary surface 43 is adjustable (see arrows $P_7$) by moving wedges 44, 45 (see arrows $P_8$, $P_9$). In between a base 46 of the secondary surface 43 and a base 47 of the primary carrier support surface 42 a gasket 48 is located to prevent passage of dirt, to enable to establish an under pressure above the carrier 49 and even to prevent any unexpected leakage of moulding material. As also shown in this figure a rim 50 of the carrier 49 is rounded and in the embodiment shown here the rim 50 is on some distance of the secondary surface 43 making is possible for a gripper to grasp the carrier 49 even with the secondary surface 43 in a higher position.

Figure 5:
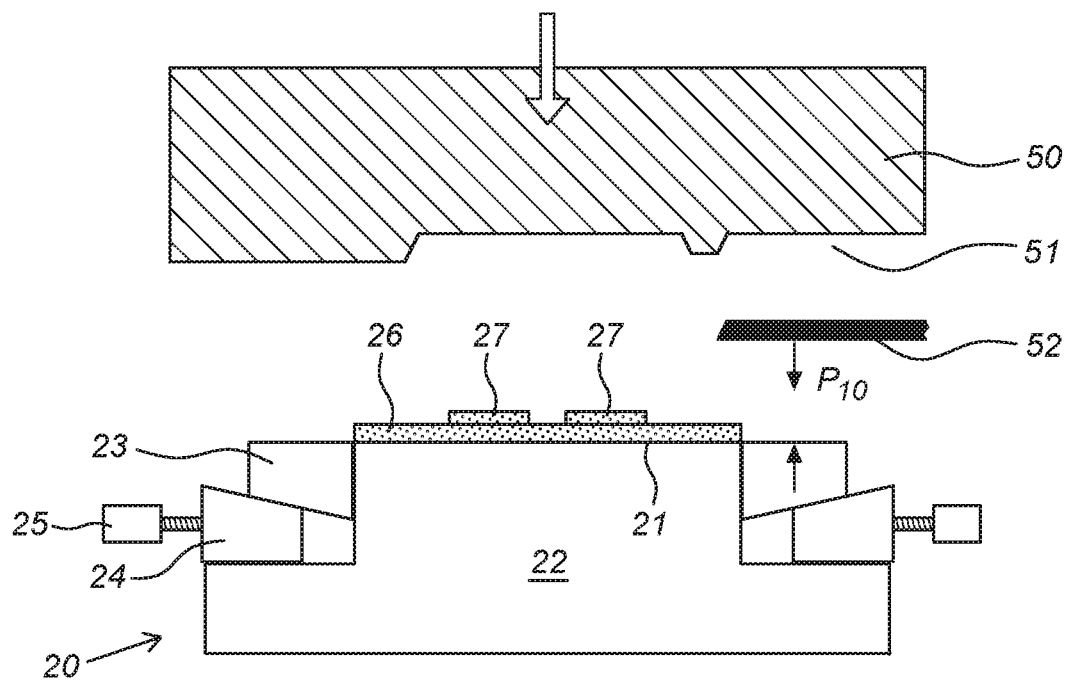
FIG. 5 a schematic view on a step in an alternative (top edge) moulding method according the present invention.

FIG. 5 shows a step in a moulding process wherein the bottom mould half 20 with the primary carrier support surface 21 corresponds with the disclosure of the bottom mould part as shown in the FIGS. 3A-3G. As the bottom half 20 corresponds also the same reference numbers have been used for this part of the mould. Different is a second mould part 50 that is now provided with a aperture 51 for holding an individual moveable moulding material feed 52. Such moulding material feed 52 is also referred to as a "top edge". The moulding material feed 52 is used to transfer the moulding material to the carrier 26 passing the side of the carrier 26 without problems of leakage while keeping the edge of the carrier 26 free of moulding material. For a correct positioning the moulding material feed 52 is to be brought in contact with the carrier 26 by moving it towards the carrier 26 (see arrow $P_{10}$). A problem in this contact could be that the carrier 26 becoming gets damaged (cracked). An important advantage of the present invention is that the secondary surface 23 may be moved upward (here by moving the wedges 24 as explained in relation to FIG. 3A) so that the secondary surface 23 is more or less level with the upper side of the carrier 26. The secondary surface 23 is then used as a support for the moulding material feed 52 thus chance of damaging the carrier 26 due to the contact with the moulding material feed 52 is now very limited.

The invention claimed is:

1. A mould half for a mould for transfer moulding encapsulating electronic components mounted on a carrier, wherein a mould part to support the carrier has a contact surface that comprises a primary carrier support surface, wherein the primary carrier support surface is surrounded by a secondary surface, wherein the secondary surface is directly in contact with and supported by a wedge, wherein the wedge is displaceable by a drive for height adjustment of the secondary surface relative to the height of the primary carrier support surface, wherein the secondary surface comprises a moulding material feed support, and wherein the secondary surface is adjusted upward relative to the height of the primary carrier support surface to support a moulding material feed.

2. The mould half according to claim 1, wherein the mould half comprises a mould half base that is stationary connected to the primary carrier support surface and that is adjustable connected with the surrounding secondary surface through the drive for height adjustment.

3. The mould half according to claim 1, wherein the drive for height adjustment of the secondary surface relative to the height of the primary carrier support surface is pressure or position controlled.

4. The mould half according to claim 1, wherein the drive for height adjustment of the secondary surface comprises at least one pneumatic or hydraulic cylinder.

5. The mould half according to claim 1, wherein the secondary surface also carries at least one guide for encapsulating material.

6. The mould half according to claim 1, wherein the primary carrier support surface and secondary surface are at least moveable between a position wherein the primary carrier support surface and secondary surface are on a same level and a position wherein the secondary surface is equal or more than a thickness of the carrier higher than the primary carrier support surface.

7. The mould half according to claim 1, wherein between the primary carrier support surface and secondary surface a gasket is located.

8. The mould half according to claim 7, wherein the gasket between the primary carrier support surface and secondary surface is an operable gasket.

9. The mould half according to claim 1, wherein the mould half comprises a measurement sensor for measuring a relative position of the primary carrier support surface and secondary surfaces.

10. A mould for transfer moulding encapsulating electronic components mounted on a carrier, comprising at least two mould parts which are displaceable relative to each other, comprising a mould half according claim 1 and an opposite clamping mould part.

11. The mould for transfer moulding encapsulating electronic components according to claim 10, wherein at least the opposite clamping mould part is provided with at least one mould cavity recessed in a contact side, with the contact side of the opposite clamping mould part with the at least one mould cavity being configured to engage on the carrier around the electronic components to be encapsulated.

12. The mould for transfer moulding encapsulating electronic components according to claim 10, wherein a contact side of the opposite clamping mould part is also provided with a feed channel for moulding material.

13. The mould for transfer moulding encapsulating electronic components according to claim 10, wherein the moulding material feed is provided between the mould half and the opposite clamping mould part, wherein the opposite clamping mould part is provided with an aperture to hold the moulding material feed in a clamped position of the mould half and the opposite clamping mould part.

14. A method for transfer moulding encapsulating electronic components mounted on a carrier using a mould according to claim 10, comprising the processing steps of:
   a) positioning a carrier onto the primary surface of the carrier supporting mould half such that the electronic components face a mould cavity, wherein the secondary support surface is located on the same side of the electronic components carrying surface of the carrier as the primary support surface;
   b) moving the mould parts towards each other, such that the mould parts are clamping the carrier between the primary support surface and the mould cavity recessed contact side, while the mould cavity is enclosing the electronic components to be encapsulated;
   c) moving the secondary support surface towards the mould cavity recessed contact side of the opposite clamping mould part;
   d) transferring a liquid moulding material via a feed channel in the mould cavity recessed contact side into the mould cavity;
   e) at least partially curing the moulding material;
   f) moving the mould parts apart from each other; and removing the carrier with moulded electronic components from the primary support surface of the carrier supporting mould half.

15. An encapsulation method according to claim 14, wherein after moving the mould parts apart the secondary support surface is moved further away from the opposite mould part than the electronic components carrying surface of the carrier.

16. The encapsulation method according to claim 14, wherein during processing step c) the secondary support surface is moved towards the mould cavity recessed contact side of the opposite mould part until a specific closing pressure level of the secondary support surface is reached.

17. The method for transfer moulding encapsulating electronic components mounted on a carrier using a mould half according to claim 14, wherein the position of the secondary support surface relative to the primary support surface is registered and for instance fed back to an automatic process control.

18. The mould half according to claim 1, wherein the drive for height adjustment of the secondary surface comprises an electric driven spindle.

* * * * *